(12) United States Patent
Chen (10) Patent No.: US 10,831,963 B1
(45) Date of Patent: Nov. 10, 2020

(54) APPARATUS AND METHOD OF PARALLEL ARCHITECTURE FOR NVDIMM

(71) Applicant: Kong-Chen Chen, Gilroy, CA (US)

(72) Inventor: Kong-Chen Chen, Gilroy, CA (US)

( * ) Notice: Subject to any disclaimer, the term of this patent is extended or adjusted under 35 U.S.C. 154(b) by 0 days.

(21) Appl. No.: 16/114,153

(22) Filed: Aug. 27, 2018

Related U.S. Application Data

(60) Provisional application No. 62/550,618, filed on Aug. 26, 2017.

(51) Int. Cl.
| | |
|---|---|
| *G06F 17/50* | (2006.01) |
| *G06F 9/30* | (2018.01) |
| *G06F 9/50* | (2006.01) |
| *G06F 12/00* | (2006.01) |
| *G06F 13/28* | (2006.01) |
| *G06F 13/36* | (2006.01) |
| *H05K 7/10* | (2006.01) |
| *G06F 30/39* | (2020.01) |
| *G06F 12/02* | (2006.01) |

(52) U.S. Cl.
CPC .......... *G06F 30/39* (2020.01); *G06F 9/30029* (2013.01); *G06F 9/5061* (2013.01); *G06F 12/0246* (2013.01); *G06F 13/28* (2013.01); *G06F 13/36* (2013.01); *H05K 7/10* (2013.01)

(58) Field of Classification Search
CPC .... G06F 30/39; G06F 9/30029; G06F 9/5061; G06F 12/0246; G06F 12/147; G06F 13/00; G06F 13/28; G06F 13/36; G06F 13/23; H05K 7/10

USPC ....... 716/110, 119, 122, 123, 124, 125, 132, 716/131; 711/2, 5, 101, 117, 120, 130; 710/22, 301, 308, 313, 315
See application file for complete search history.

(56) References Cited

U.S. PATENT DOCUMENTS

| | | | |
|---|---|---|---|
| 9,785,365 B1 * | 10/2017 | Shallal | G06F 13/28 |
| 10,147,712 B1 * | 12/2018 | Lendvay | G06F 13/1689 |
| 10,635,586 B2 * | 4/2020 | Shallal | G06F 11/14 |
| 10,679,722 B2 * | 6/2020 | Helmick | G11C 29/52 |
| 2005/0139977 A1 * | 6/2005 | Nishio | G06F 1/184 257/686 |
| 2008/0228996 A1 * | 9/2008 | Tan | G06F 3/0613 711/103 |
| 2009/0083476 A1 * | 3/2009 | Pua | G06F 3/0613 711/103 |
| 2010/0205348 A1 * | 8/2010 | Moshayedi | G11C 5/14 711/102 |
| 2012/0271990 A1 * | 10/2012 | Chen | G11C 7/1072 711/103 |
| 2015/0261446 A1 * | 9/2015 | Lee | G06F 13/385 711/103 |
| 2015/0310898 A1 * | 10/2015 | Takefman | G11C 7/1012 711/105 |
| 2016/0342487 A1 * | 11/2016 | Ware | G11C 7/20 |
| 2016/0350002 A1 * | 12/2016 | Vergis | G06F 12/02 |
| 2017/0109058 A1 * | 4/2017 | Shallal | G06F 3/0611 |
| 2017/0206036 A1 * | 7/2017 | Pax | G06F 12/0246 |
| 2017/0351626 A1 * | 12/2017 | Lalam | G06F 13/4027 |
| 2018/0005670 A1 * | 1/2018 | Lee | G06F 3/0644 |
| 2018/0059944 A1 * | 3/2018 | Helmick | G06F 3/0604 |

(Continued)

*Primary Examiner* — Phallaka Kik
(74) *Attorney, Agent, or Firm* — Alston & Bird LLP (57) ABSTRACT

A non-volatile dual-in-line memory module (NVDIMM) with a parallel architecture is described. It enables parallel access to on-board nonvolatile memory (NVM) to improve storage throughput and to alleviate layout design constraints.

27 Claims, 5 Drawing Sheets

(56) References Cited

U.S. PATENT DOCUMENTS

| | | | |
|---|---|---|---|
| 2018/0059976 A1* | 3/2018 | Helmick | G06F 3/0688 |
| 2018/0060257 A1* | 3/2018 | Nygren | G06F 11/1004 |
| 2018/0197584 A1* | 7/2018 | Lee | G06F 3/0647 |
| 2018/0246643 A1* | 8/2018 | Jenne | G06F 3/061 |
| 2018/0246647 A1* | 8/2018 | Sankaranarayanan | G06F 12/00 |
| 2018/0329850 A1* | 11/2018 | Lim | G06F 3/0614 |
| 2019/0196725 A1* | 6/2019 | Lendvay | G06F 3/0685 |
| 2019/0286560 A1* | 9/2019 | Shallal | G06F 11/14 |
| 2019/0347036 A1* | 11/2019 | Pax | G11C 8/00 |
| 2020/0034046 A1* | 1/2020 | Shallal | G06F 12/1441 |

* cited by examiner

FIG. 4B

APPARATUS AND METHOD OF PARALLEL ARCHITECTURE FOR NVDIMM

CROSS REFERENCE TO RELATED APPLICATIONS

This application claims priority, under 35 U.S.C. § 119(e), from U.S. Provisional Application No. 62/550,618, filed on Aug. 26, 2017, by Kong-Chen Chen, entitled "Apparatus and Method of Noble Architecture for NVDIMM," the contents of which is incorporated herein by reference in its entirety.

BACKGROUND

Various embodiments of the invention relate generally to memory modules and particularly to nonvolatile dual-in line memory modules.

A Nonvolatile Dual-In Line Memory Module (NVDIMM) assembles DRAM chips and storage devices in module format for inserting into a socket at the main memory of a host system or computer. In a legacy system, the storage device is typically attached to a peripheral bus and the DRAM memory is attached to the memory bus closely coupled to its central process unit (CPU). It takes much longer latency cycles to access information in the storage device from the peripheral bus when data is missed in main memory. In addition, for some critical applications, the contents in memory must be retained when encountering a power failure. One solution is to add a NAND Flash chip and a FPGA as Flash controller, plus backup battery, to the memory module so that all contents in DRAMs on module can be successfully transferred to and stored at the NAND Flash when there is a power failure. This is simply a data backup solution for memory module.

Lately, NVDIMM has been designed to support on-the-fly data storage by sharing the same memory bus for the DRAM access and for the NAND Flash access so that a memory module is functioning as a memory device and a storage device. It improves computer performance substantially and reduces hardware cost by eliminating the peripheral bus and the need to access storage devices on slow peripheral bus. However, one common design approach of NVDIMM uses a single FPGA to facilitate the data transfer from the memory data bus to on-board NAND Flashes. There are some drawbacks. One is the layout design constraint. All data bits input to the gold fingers of memory module must be routed to the single FPGA location on PCB for transferring data to the on-board NAND Flash chips. This may cause a severe wire clogging in the PCB layout design near the area where the FPGA is located. A thicker PCB with more laminated layers or finer pitch routing traces may be required for such a design.

Another consideration is that a low cost FPGA chip may have limited number of I/Os. The full width of memory data bus may not be able to transfer through the FPGA chip in one transaction cycle due to the I/O constraints, which may degrade the performance of NVDIMM, especially for a slower storage device. A solution to address such drawbacks is desirable.

SUMMARY

Briefly, a NVDIMM design by using a plurality of interface bridge chips to facilitate parallel data transfer between the memory data bus and the on-board non-volatile memory (NVM) is described, wherein a bridge controller function is incorporated in the NVDIMM to synchronize the operations of the plurality of interface bridge chips for orderly transfers of data between the memory bus and NVMs. Enabling parallel accessing to multiple NVMs on module would have a higher data store bandwidth than only using a single, narrower NVM interface port to access the NVM chips on module.

The plurality of interface chips can be partitioned into multiple subgroups with each subgroup being controlled by an output port from the on-board bridge controller function, where one subgroup can access on-board NVM independently from the other subgroup. This is a useful feature especially only a small amount of data to be written or revised in the storage device. It is unnecessary to waste the entire bandwidth of memory data bus for doing such a task. Similarly, the plurality of DRAM chips on module can be partitioned into multiple subgroups with each subgroup being controlled by one output port at the on-board register chip and each subgroup can operate independently. The types of partitions can be of same size or different sizes based on the performance requirements. The partition can also be re-configured automatically on-the-fly by regrouping the connection of output ports in the register chip and/or the bridge controller function.

A further understanding of the nature and the advantages of particular embodiments disclosed herein may be realized by reference of the remaining portions of the specification and the attached drawings.

DETAILED DESCRIPTION OF EMBODIMENTS

The following description describes the design of a non-volatile memory module. In accordance with an embodiment, a parallel architecture incorporating a set of interface bridge chips at the interface between the memory data bus and the set of on-board storage devices is disclosed. Data of full memory data bus width is transferred in parallel to on-board storage devices through the set of interface bridge chips for a better performance and to alleviate layout design constraints with a less congregated routing to avoid adding more routing layers or using a thicker printed circuit board (PCB) at the non-volatile dual in-line memory module (NVDIMM).

In an embodiment, a non-volatile memory module is configured to include a printed circuit board (PCB) including an edge connector where the edge connector has connection contacts to a memory data bus, a memory command/address bus, memory control signals, and power and ground. The memory control signals include memory access control signals comprising of chip select and chip enable, and memory data bits control signals comprise data strobe, and data mask control. The memory module further includes a number of dynamic random access memory (DRAM) chips, where the DRAM chips are coupled to the memory data bus, and a register chip that controls data transfer between the memory data bus and the plurality of DRAM chips.

Additionally, the memory module includes a plurality of non-volatile memory chips, a plurality of interface bridge chips. Each of the plurality of interface bridge chips is coupled to a respective subset of data bits at the memory data bus, wherein the subset of data bits are coupled to the one of the plurality of DRAM chips, and the one of the plurality of interface bridge chips is coupled to a respective one or more chips of the plurality of non-volatile memory chips. The memory module also includes a bridge controller function controls the operation of the plurality of interface bridge chips for parallel data transfer between the memory data bus and the plurality of non-volatile memory chips.

Figure 1:
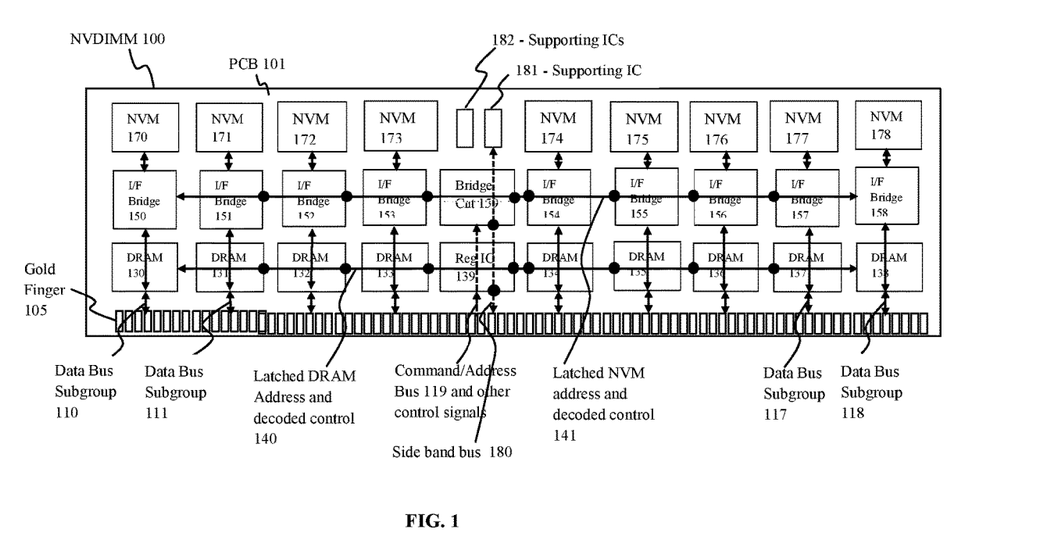
FIG. 1 shows a NVDIMM design example in parallel architecture.

FIG. 1 shows an exemplary design of a non-volatile dual-in-line memory module (NVDIMM) with a parallel architecture, in accordance with an exemplary embodiment and method. In FIG. 1, the NVDIMM 100 includes a printed circuit board (PCB) 101 with a plurality of gold fingers 105 at its edge for plugging into a socket on the memory bus of a host system or computer motherboard. The gold fingers 105 provide electrical connection between the NVDIMM 100 and the host system or computer motherboard.

The electrical contacts on the gold fingers 105 include the coupling to a memory data bus from the memory controller of the host system. The memory data bus, which is formed from a group of memory data signals, are coupled to the DRAM chips 130, 131, . . . , 138 on NVDIMM 100 through gold fingers 105. Depending on the particular configuration of DRAM chips chosen, which may be of x4, x8, or x16-bit, the memory data bus may be further partitioned into subgroups with each subgroup comprising of 4, 8, or 16 data bits. The memory data bus in FIG. 1 contains the multiple data bus subgroups 110, 111, . . . , 118, where one data bus subgroup is coupled to a respective DRAM chip. Besides the data bits, each data bus subgroup also includes an associated Data Strobe, Data Mask and Inversion Control signals for controlling the data bits at the respective DRAM chip.

The gold fingers 105, in NVDIMM 100, also couples to an address/command bus 119 and other controls signals for DRAM access, such as Chip Select, Clock and Clock Enable, among other signals. The NVDIMM 100 may also include a side band bus 180 connected to gold fingers 105 for accessing on-board supporting integrated circuits (ICs) 181 and 182. For example, an I²C bus may be chosen as the side band bus 180 to access the supporting IC 181, which may be an EEPROM chip with Serial Presence Detect (SPD) information, a temperature sensor, or an integrated chip including both features. There are also power and ground connections at the gold fingers 105. The SPD in NVDIMM 100 contains module configuration information and relevant timing parameters for module operation. The temperature sensor detects temperature information of the NVDIMM 100, which may be queried by the host system through the side band bus 180 for adjusting the DRAM operation parameters, such as the refresh rate. It is noted that as used and referred to herein, "host system" and "host" are anonymous terms. The supporting IC 182 may be one or more voltage regulators added to NVDIMM 100 to regulate the supply voltage to different voltage levels for chips or components on NVDIMM 100 to use. It may also be a voltage detector to detect power failure on NVDIMM 100.

In FIG. 1, the NVDIMM 100 also includes a set of DRAM chips 130, 131, . . . , 138, a set of interface (I/F) bridge chips 150, 151, . . . , 158, a set of non-volatile memory (NVM) chips 170, 171, . . . , 178, a register chip 139 for DRAM access, a bridge controller function or device 159 to control and synchronize the operation of the set of interface bridge chips 150, 151, . . . 158, besides the supporting ICs, such as EEPROM and/or temperature sensor 181, voltage regulator and/or voltage detector 182, on the PCB 101.

In NVDIMM 100, the number of DRAM chips on module is generally determined by the width of memory data bus, the DRAM chip configuration, and the capability to handle error correction. For example, in the exemplary implementation of FIG. 1, the NVDIMM 100 is connected to a 64-bit data bus, using an x8-configuration DRAM chip with ECC capability, thus there are 9 DRAM chips on NVDIMM 100. If the NVDIMM 100 is double-sided to include more DRAM chips, described relative to FIG. 1, on the opposite side of the NVDIMM 100 to increase memory capacity, then the number of DRAM chips on the module is doubled to 18 chips. It is noted that the design example of NVDIMM 100, shown in FIG. 1, only shows one-side of the PCB 110 with each DRAM chip 130, 131 . . . or 138 coupled to a respective data bus subgroup 110, 111 . . . or 138.

The NVDIMM 100 also include register chips 139. The register chip 139 latches and decodes the command/address bus 119, and other control signals input from the memory bus. The latched address and the associated decoded control signals 140 are then output from the register chip 139 to control the access to DRAM chips 130, 131, . . . , 138. Depending on the configuration of DRAM chip, the address of a DRAM chip may also include a few higher-order bank group bits (BG) and bank address bits (BA), besides the lower order address bits, being the rows and columns for accessing the cell array of a DRAM bank.

When the NVDIMM 100 is a double-sided memory module, additional register chip may be added to the module to reduce the output driver loading of the register chip, for example to drive the DRAM chips located on the second side of PCB 101. Regardless of the addition of register chips, each register chip is still connected to access multiple DRAM chips comprising of a full width of memory data bus.

The NVDIMM 100 also includes a set of non-volatile memory (NVM) chips 170, 171, . . . , 178. There are different types of non-volatile memories, such as but without limitation, NAND Flash, phase change memory (PCM), resistive random access memory (ReRAM), and ferroelectric random access memory (FeRAM). Each type of non-volatile memory has its own advantage(s) and disadvantage(s), such as limitations on its operating voltage, read/write speed, memory density, reliability, endurance, and/or data retention capabilities. As technology improves to resolve the limitations of non-volatile memories, various types of non-volatile memories with a proper controller may be adopted for the NVDIMM design using the parallel architecture to access the NVMs of the NVDIMM.

Coupled between DRAM chips 130, 131, . . . , 138 and NVM chips 170, 171, . . . , 178, there are a set of interface bridge chips 150, 151, . . . , 158 on the NVDIMM 100. Each interface bridge chip includes a DRAM interface port coupled to a corresponding subgroup of data bus, and further includes a NVM interface port coupled to one or more corresponding NVM chip on the NVDIMM 100. Through the set of interface bridge chips 150, 151, . . . , 158, the contents on memory data bus are transferred to NVM chips 170, 171, . . . , 178, and the contents on NVM chips 170, 171, . . . , 178 are retrieved to the memory data bus in parallel. The set of interface bridge chips 150, 151, . . . , 158 enables access to a plurality of NVMs in parallel, which has advantages over the use of a single interface port to transfer a full width of data from the memory data bus into NVM, especially when the NVM is a slow device and the single interface port is of narrow bus to NVM.

Figure 2:
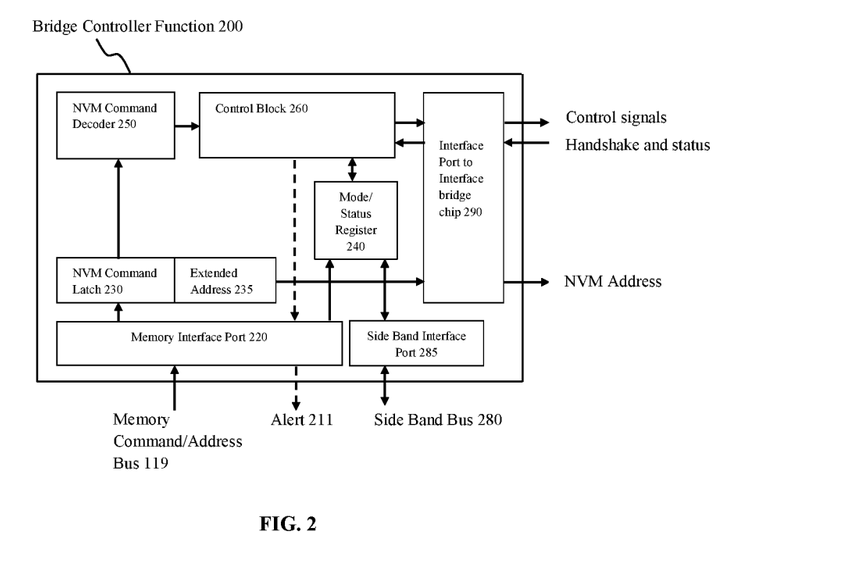
FIG. 2 shows an exemplary functional block diagram for the bridge controller function.

The operation of the set of interface bridge chips 150, 151, . . . , 158, of NVDIMM 100, is controlled by a bridge controller function or bridge controller device 159. The bridge controller function or device 159 (namely described as "bridge controller function" device hereafter) can be a separate chip, or it can be integrated into the register chip 139 as an extra function. FIG. 2 shows an exemplary functional block diagram of the bridge controller function device 159.

In FIG. 2, an exemplary bridge controller function device 200 monitors activity on the memory command/address bus 119 at its memory interface port 220. When a command/address issued by the host memory controller is a NVM command/address, the NVM command is latched into the NVM command latch 230 and the NVM address is latched into the extended address latch 235. Since the size of storage device, i.e. the address range of a nonvolatile memory, is generally much larger than that of a DRAM chip, more address bits for the nonvolatile memory access are required in the NVDIMM 100. The address to access NVM is an extended address. It may take more clock cycles to transfer an extended address to the bridge controller function 159 than to transfer a DRAM address to the register chip 139, as shown in FIG. 1.

For managing access to the non-volatile memories of the NVDIMM 100, a set of mode and status registers 240 may be included in the bridge controller function 200 to indicate the configuration and operation modes for NVM access, such as data transfer sizes, time-out information and transaction status. The mode and status registers 240 may be accessed through the memory bus in-band channel, such as through the memory command/address bus 119, to write contents/data into the mode registers. Alternatively, the mode and status registers 240 can be accessed by way of a side band bus 280, for example an I²C bus, via the side band interface port 285.

In operation, a command from the host is latched in the NVM command latch 230 and the latched command is decoded by the NVM command decoder 250. The decoded information is then input to the control block 260 to generate control signals, such as read or write control, to the interface bridge chips. The decoded signals and the latched NVM address 141 are then output through the interface port to interface bridge chip 290 for on-board NVM access. "On-board", as used herein refers to within the NVDIMM 100.

The hand-shake and status signals from the set of interface bridge chips 150, 151, . . . , 158, shown in FIG. 1, are monitored at the interface port 290 by the bridge controller function device 200. An open-drain or open collect circuit is typically effective to monitor the status of all interface bridge chips connected to the interface port 290 to determine if a transaction is successfully completed. In case an error or time-out takes place during a NVM access, the specific type of abnormality is detected by the control block 260 and logged into the status register in 240. An alert signal 211 is then asserted through the memory interface port 220 to notify the host.

In NVDIMM 100, an interface bridge chip and its corresponding DRAM chip are coupled to a subgroup of the memory data bus, as shown in FIG. 1. For example, the DRAM chip 130 and interface bridge chip 150 are coupled to the memory data bus subgroup 110. Similarly, DRAM chip 131 and interface bridge chip 151 are coupled to the subgroup of memory data bus 111, and so on. Obviously, the layout placement of the DRAM chip, the associated interface bridge chip and the associated NVM can be grouped together and lined up within a small area on PCB 101, the routing traces to connect devices within each group/subgroup would be shorter and more straightforward thereby alleviating layout design constraints and avoiding adding more routing layers and/or using a thicker PCB. There is also minimal data trace crossing from one group to the other group to minimize signal interference in the layout design of the NVDIMM 100.

In an embodiment, in accordance with the configuration example of NVDIMM 100, each of the DRAM chip is coupled to a neighboring interface bridge chip and then the interface bridge chip in sequence is coupled to its associated NVM chip with a fixed connection as opposed to a switching connection. At times, resistors or data buffers may be inserted in NVDIMM 100, between the input of memory data bus and the DRAM chips 130, 131, . . . , 138, to match the trace impedance for a better signal quality or to reduce the load of the memory data bus.

In an embodiment, the bridge controller function controls the transfer of data from the memory data bus to the DRAM chips and controls the interface bridge chips to transfer the data from the DRAM chips to the NVM chips. Two approaches may be implemented to facilitate the data transfer from the memory data bus to the DRAM chips 130, 131, . . . , 138 and to the interface bridge chips 150, 151, . . . , 158, in NVDIMM 100. One approach is to have data written to the DRAM chip and to the interface bridge chip to be mutual-exclusively, i.e. the data from the memory data bus will be either written into the DRAM chip or to the interface bridge chip, but not both. For example, if a data on the memory data bus is to be written into the DRAM chips 130, 131, . . . , 138, then only the chip select to the DRAM chips is enabled while the chip select to the interface bridge chips 150, 151, . . . , 158 is disabled. Similarly, if data on the memory data bus is only to be written into the interface bridge chips 150, 151, . . . , 158, then only the chip select for the interface bridge chips is asserted.

The register chip 139 and the bridge controller function device 159, of NVDIMM 100, monitor the incoming commands on the command/address bus 119. If the incoming command is for a DRAM write, then the register chip 139 asserts the chip select for the set of DRAM chips 130, 131, . . . , 138 to latch the incoming data. If the incoming command is for the NVM write, then the bridge controller function 159 generates a chip select signal for the set of the interface bridge chips 150, 151, . . . , 158 to latch data from the memory data bus.

Another approach is to enable the write of data to the DRAM chip and the interface bridge chip simultaneously. In this case, the register chip 139, of NVDIMM 100, will generate a chip select signal for both the DRAM chips 130, 131, . . . , 138 and the interface bridge chips 150, 151, . . . , 158. The chip select signal for the write to the interface bridge chip that is generated by the register chip 139 may be ORed (a function that selects one or another of its inputs) with the chip select signal that is generated by the bridge controller function 159 to support both approaches.

In the case that data to the DRAM chip and the interface bridge chip are not to be written simultaneously in the same memory bus transaction, the host memory controller would need to issue two separate complete bus transactions. That is, the host memory controller would need to generate a DRAM write transaction by issuing a DRAM command/address to the register chip 139, followed by a sequence of burst data to the DRAM chips 130, 131, . . . , 138 to latch data into the DRAM chips with the assertion of DRAM chip select signal. And then the host memory controller would need to generate a second NVM write bus transaction by issuing a NVM command/address to the bridge controller function 159, followed by a sequence of burst data to be latched by the interface bridge chips 150, 151, . . . , 158 with the assertion of a chip select signal for the interface bridge chip. In the dual transaction case, the burst data to the DRAM chip and the burst data to the interface bridge chip are independent and can be distinct data.

Occasionally, it may be desirable to have the same set of burst data to write into the DRAM chips 130, 131, . . . , 138 and the interface bridge chips, 151, 152, . . . , 158 simultaneously. This can eliminate the additional bus cycles to write a set of burst data into the interface bridge chip, thus improving system performance. In this case, the host memory controller would simply need to issue a DRAM command/address to the register chip 139, followed by issuing a burst of write data, followed by a NVM command/address cycle to the bridge controller function 159 for the interface bridge chips 150, 151, . . . , 158 to write the already latched data into the associated NVM chips 170, 171, . . . , 178. Both approaches can be supported by NVDIMM 100 with the help of the host memory controller to meet the need of different applications. In an exemplary embodiment, each of the NVM chips 170, 171, . . . , 178 has an interface port for sending and receiving data with the interface bridge chips 150, 151, . . . , 158. Depending on the number of data bits at the NVM interface port, sometimes two or more of the interface bridge chips 150, 151, . . . , 158 may be grouped together to access a NVM chip having a wider data bus at its interface port. For example, two interface bridge chips of x8 data bit each may be grouped together to access the same NAND Flash chip having a 16-bit data interface port. Similarly, in another configuration, four interface bridge chips of x4 data bits each may be grouped together to access one NAND Flash chip of 16-bit data interface. Grouping local interface bridge chips to form a combined data path width matching the data port width of the corresponding NVM chips has no performance impact, nor does it suffer from relevant increase in the routing complexity under the parallel architecture of FIG. 1. The transfer of data in a full memory data bus width by a single transaction to NVMs is still achievable for the parallel NVDIMM architecture with such a grouping.

At times, applications may require more storage capacity in which case additional NVM chips may be added to the NVDIMM 100 and connected to the NVM interface ports of respective interface bridge chips.

Figure 3:
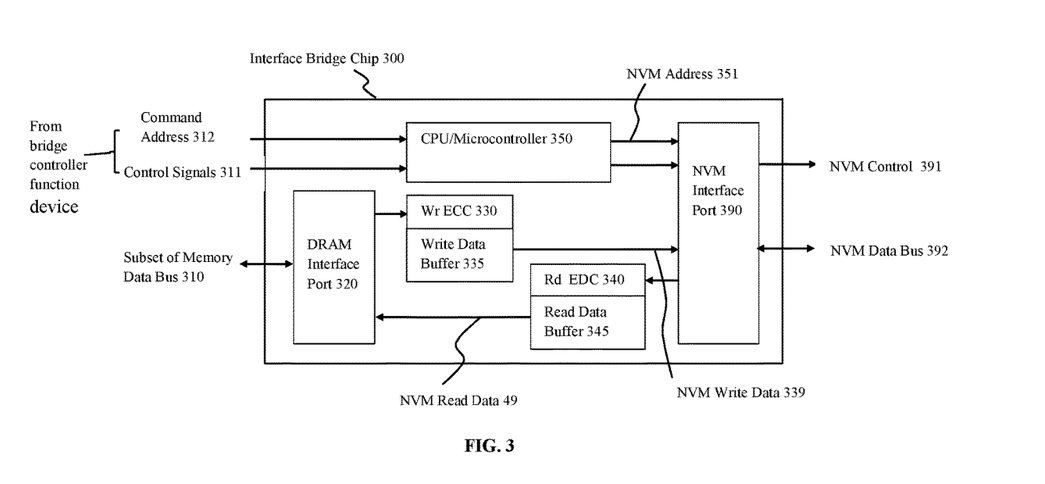
FIG. 3 shows an exemplary functional block diagram for the interface bridge chip.

FIG. 3 is an exemplary functional block diagram of an interface bridge chip 300. If NAND Flash is chosen as the non-volatile memory, for example, to describe the basic functionality, the interface bridge chip 300 is basically a NAND Flash controller except that the DRAM interface is chosen to replace the peripheral interface, such as SATA. In FIG. 3, a subset of memory data bus 310 from the host memory controller is coupled to the DRAM interface port 320. When write data is received from the subset of memory data bus 310 at the DRAM interface port 320, it is input to the write error-correcting code (ECC) unit 330. The error correction code for correcting potential data error is generated on-the-fly as data is being written into the write data buffer 335. The central processing unit (CPU) or microcontroller 350, which receives control signals 311 and command address 312 input from the bridge controller function, generate proper controls and address for the NVM interface port 390 to access the NVM chips. Because of limited endurance in NAND Flash, wear leveling software is used by the CPU or microcontroller 350 to translate the incoming command address 312 into a NVM address 351 where the non-defective NVM cells locate.

Because of the large number of address bits used to access the NVM chip and because of the consideration for package pinout compatibility of higher capacity NVMs, the NVM address 351 and write data 339 are often multiplexed onto a single bus for NVM access. The NVM interface port 390 often uses the lower order bits of NVM address 351 and the write data 339 to multiplex them onto the NVM data bus 392 when accessing a memory array of the NVM, while the higher order bits of NVM address 351 are used as the chip select control signals to access NVM chips connected to the NVM interface port 390. Other control signals 391 for NVM access are also output from the NVM interface port 390.

In FIG. 3, the NVM data bus 392 coupled to the coupled to the NVM interface port 390 also receives read data from the NVM chip. Because there is ECC function embedded in the NVM chip, an error detection code 340 may be sufficient to detect the accuracy of the received (read) data.

Another advantage of the parallel architecture is its support of split bus operation. For example, a 64-bit data bus may be split into two 32-bit data busses to meet various application requirements. The two split 32-bit bus can operate independently of each other and in parallel using the parallel architecture of the NVDIMM 100.

Figure 4A:
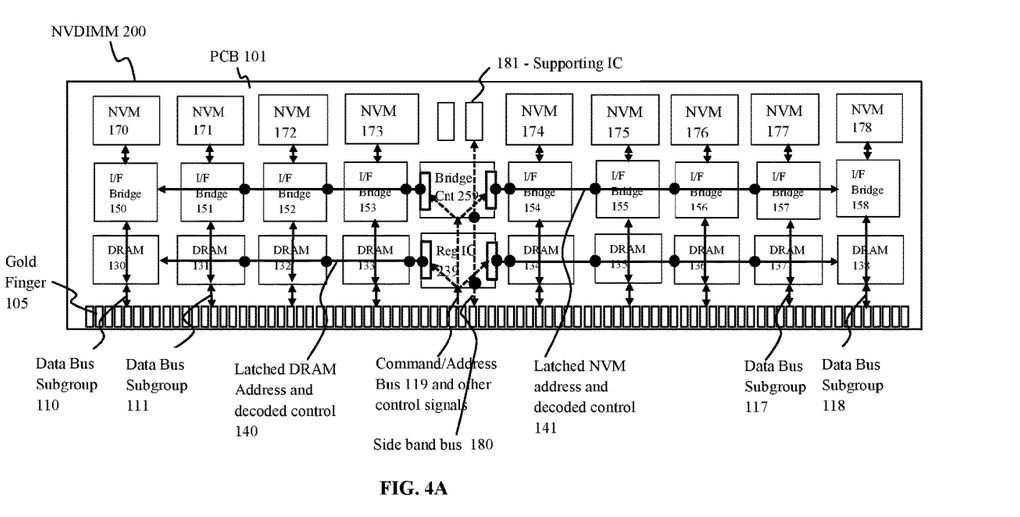
FIG. 4A shows a design example to partition NVDIMM into two independent subsets by using two output ports in register chip and two output ports in bridge controller function.

FIG. 4A is an exemplary implementation of a NVDIMM 200 to convert a 64-bit NVDIMM into two independent 32-bit NVDIMMs, where two output ports are included in the register chip 239 for two sets of DRAM chip access, and two output ports are included in the bridge controller function 259 for two sets of interface bridge chip access. Each port in the register chip 239 latches its respective DRAM command and address from the command/address bus 119 for accessing a respective set of DRAM chips. Similarly, each port in the bridge controller function device 259 latches its respective NVM command and address from the command/address bus 119 for accessing a respective set of interface bridge chips.

In an embodiment, the two output ports of each of the register chip 239 and bridge controller function device 259 can operate independently of each other to support two sets of 32-bit NVM operations, or the two ports can be reconfigured and connected together in the register chip 239 and in the bridge controller function device 259 to convert the NVDIMM back to the 64-bit operation. This conversion can be done on-the-fly to meet the needs of different applications. The reconfiguration to connect or disconnect more than one output port\ in the register chip and in the bridge controller function device can be achieved by changing the contents of a mode register of the register chip and the bridge controller function device.

For NVDIMM 200 in FIG. 4A, for the 32-bit operation, two sets of DRAM command and DRAM addresses will be input to the register chip 239 through the command/address bus 119, each set being input during a distinct memory cycle. The first set can be to latch information coupled onto the left port to control access to the DRAM chips located on the left side of NVDIMM 200, and the second set can be to latch information coupled onto the left port to control access to the DRAM chips located on the right side of NVDIMM 200. Similarly, two sets of NVM command and NVM addresses can be input to the bridge controller function 259 using a common command/address bus 119 on different command/address transactions, where one set can be for latching onto the left port to control the operation of the interface bridge chips located on the left side of NVDIMM 200 and the second set can be for latching onto the right port to control the operation of the interface bridge chips located on the right side of NVDIMM 200.

A 32-bit split NVDIMM can be implemented by doubling the output ports of the register chip 139 and the output ports of the bridge controller function 159 in NVDIMM 100 with each port controlling one 32-bit operation. Similarly, a 64-bit data bus may be split into four 16-bit data bus with a similar modification to the register chip 139 and the bridge controller function 159, with four output ports, so that four 16-bit groups can operate simultaneously in parallel and independently of one another.

Figure 4B:
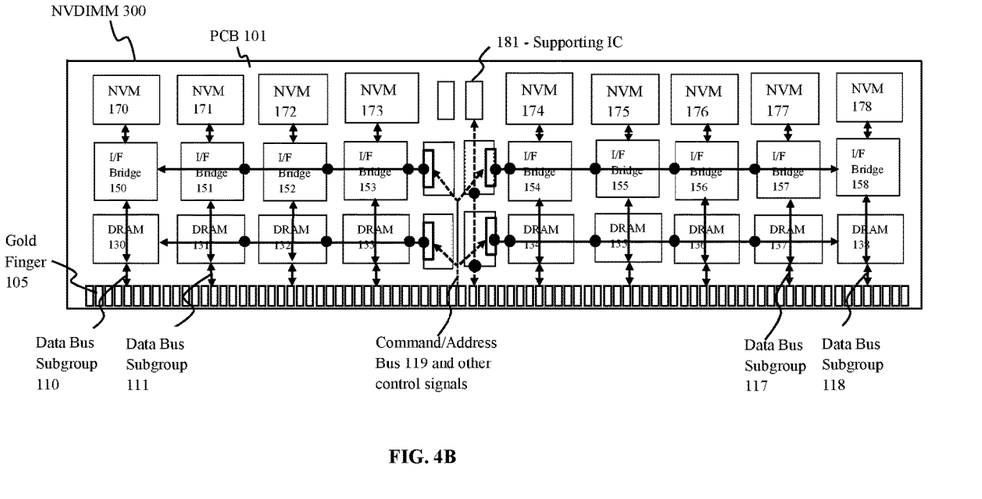
FIG. 4B shows an alternative design example to partition NVDIMM into two independent subsets by using two single-output port registers and two single-output port bridge controller functions in NVDIMM.

An alternation to such implementation is to double or quadruple the number of register chips 139 and the number of bridge controller chips 159 as shown NVDIMM 300. in FIG. 4B, without doubling or quadrupling the number of output ports for these devices.

As another example, if a 16-bit DRAM chip and a 16-bit interface bridge chip are chosen to couple to a 16-bit subgroup of memory data bus, and if the 16-bit interface bridge chip is connected to a 16-bit NVM chip, such as a 16-bit NAND Flash, then the NVDIMM will be able to support four independent 16-bit parallel memory operations and 16-bit parallel stores at the same time seamlessly, where four output ports are implemented in the register chips 139 and four output ports are implemented in the bridge controller function 159.

In an embodiment, by incorporating multiple output ports at the register chip 139 and multiple ports at the bridge controller function 159, the DRAM chips 130, 131, ..., 138 and the interface bridge chips of NVDIMM 100 can be partitioned and configured to function as if there were multiple NVDIMMs functioning independently of one another, each with a data bus width smaller than the data bus width of the totality of all of the multiple NVDIMMs. By re-configuring connections of the output ports in the register chip and bridge controller function, the operation of NVDIMM can function as a single full-sized bus width NVDIMM, or two half-size bus width NVDIMMs, or four quarter-size bus width NVDIMMs, or even a combination of one half-size bus width and two quarter-size bus width NVDIMMs.

In an embodiment, the reconfiguration of multiple output ports in the register chip and the multiple output port in the bridge controller function can be different. For example, the DRAM chips can be partitioned into four independent subgroups for a 16-bit operation, while the storing of data into NVM chips can be operated in a single 64-bit group, based on the applications need as the access to DRAMs and the access to on-board storage devices can be two independent operations. The flexibility realized by the parallel architecture of various NVDIMMs, such as without any limitation, those described herein, is a useful feature.

Parallel memory accessing is desirable for artificial intelligence applications, among other applications. A NVDIMM with parallel architecture can be configured to support multiple, parallel memory operations of smaller width of data bits with narrower split data retained by the NVM chips is a powerful feature.

Depending upon the configuration of the NVDIMM 100, the interface bridge chips 150, 151, ..., 158 can be a full-featured NVM controller with all requisite firmware to control the operation of respective NVM chips 170, 171, ..., 178. Alternatively, it can be a simple interface conversion function that includes minimum firmware for accessing the NVM chips 170, 171, ..., 178. For example, if Embedded Multi-Media Controller (eMMC) or Universal Flash Storage (UFS) devices are chosen as the NVM chips, where there is a built-in storage management firmware to handle such tasks as wear leveling, garbage correction, usage report, etc., the tasks to implement software for NVM management are simpler.

Although various embodiments have been described with reference to a 64-bit memory bus, it is understood that this is merely an example of a NVDIMM and that a memory bus with a different bit size from main memory may be larger than 64-bit or smaller than 64-bit, depending the application. For example, the width of an extended memory bus can be up to 80-bit wide, such as having two 32-bit subgroups on NVDIMM with each subgroup having a separate 8-bit ECC. Or for example, the width of an extended memory bus can be even up to 128-bit wide, such as, two 64-bit memory channels running in parallel. The number of data bits from the memory bus input to a memory module could be extended accordingly.

Although various embodiments have been described with reference to gold fingers as edge connector in exemplary NVDIMMs, other types of fine pitch connectors may be chosen for the memory module to replace the gold fingers, shown and discussed with reference to FIGS. 1-5, for connecting to memory bus. In an embodiment where the edge connector is a fine pitch connector, it connects to a matching connector at the memory bus.

Although the description has been described with respect to particular embodiments thereof, these particular embodiments are merely illustrative, and not restrictive.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

Thus, while particular embodiments have been described herein, latitudes of modification, various changes, and substitutions are intended in the foregoing disclosures, and it will be appreciated that in some instances some features of particular embodiments will be employed without a corresponding use of other features without departing from the scope and spirit as set forth. Therefore, many modifications may be made to adapt a particular situation or material to the essential scope and spirit.

What is claimed is:

1. A memory module configured to connect a memory bus from a host system, the memory module comprising:
 a printed circuit board including an edge connector with connection contacts to a memory data bus, a memory command/address bus, memory control signals, power and ground;
 a plurality of DRAM chips coupled to the memory data bus;
 a register chip configured to control data transfer between the memory data bus and the plurality of DRAM chips;
 a plurality of non-volatile memory chips;
 a plurality of interface bridge chips each associated with a different one of the plurality of non-volatile memory chips and configured to control transfer of data between the memory data bus and the associated non-volatile memory chip; and a bridge controller function device configured to control the plurality of interface bridge chips to facilitate parallel data transfer between the plurality of non-volatile memory chips, the plurality of DRAM chips and the memory data bus.

2. The memory module of claim 1 wherein the edge connector comprises a plurality of gold fingers located at an edge of the printed for plugging into a socket being coupled the memory bus.

3. The memory module of claim 1, wherein the edge connector is a fine pitch connector to connect to a matching connector at the memory bus.

4. The memory module of claim 1, wherein the memory control signals include memory access control signals comprising of chip select and chip enable, and memory data control signals comprise data strobe, and data mask control.

5. The memory module of claim 1, wherein a selected one of the plurality of DRAM chips being in fixed connection to a selected one of the plurality of interface bridge chips and further queued to a selected one of the plurality of nonvolatile memory chips, also in fixed connection with the selected one of the plurality of interface bridge chips, are placed at close proximity on the printed circuit board to alleviate layout design constraints with minimal signal interference.

6. The memory module of claim 1, wherein a full width of data on the memory data bus is transferrable to the plurality of non-volatile memory chips in parallel through the plurality of interface bridge chips under control of the bridge controller function device.

7. The memory module of claim 1, wherein the bridge controller function device is an integrated circuit (IC) chip.

8. The memory module of claim 1, wherein the bridge controller function device is integrated in the register chip.

9. The memory module of claim 1, wherein data write to the plurality of DRAM chips and data write to the plurality of interface bridge chips are independent transactions on the memory bus.

10. The memory module of claim 1, wherein the register chip is configured to generate chip select for the plurality of DRAM chips and the bridge controller function device is configured to generate chip select for the plurality of interface bridge chips access.

11. The memory module of claim 1, wherein the memory module provides concurrent burst data write to the plurality of DRAM chips and to the plurality of interface bridge chips from the memory data bus.

12. The memory module of claim 11, wherein the register chip is configured to generate a chip select for concurrent access to the plurality of DRAM chips and the plurality of interface bridge chips.

13. The memory module of claim 12, wherein the chip select is generated by the register chip and ORed with the chip select generated by the bridge controller function device.

14. The memory module of claim 1, wherein memory command and address input from the memory command/address bus are latched into the register chip to control access to the plurality of DRAM chips.

15. The memory module of claim 1, wherein non-volatile memory command and address input from the memory command/address bus are latched into the bridge controller function device, wherein latched non-volatile memory command is decoded to generate control signals for the plurality of interface bridge chips, and latched non-volatile memory address is delivered to the plurality of interface bridge chips to convert into address for access to the plurality of non-volatile memory chips.

16. The memory module of claim 15, wherein the latched non-volatile memory address is an extended address, wherein the extended address is latched and translated by each of the plurality of interface bridge chips into wear-levelled address to access respective one of the plurality of non-volatile memory chips.

17. The memory module of claim 1 wherein the memory module provides split bus operations, wherein the memory data bus is partitioned into a plurality of data subgroups of narrower bus width, wherein the plurality of DRAM chips are partitioned into a plurality of DRAM subgroups, wherein and the plurality of interface bridge chips is partitioned into a plurality of interface bridge chip subgroups, wherein the plurality of non-volatile memory chips is partitioned into a plurality of non-volatile memory chip subgroups, wherein a first one of DRAM subgroups and a first one of interface bridge chip subgroups are coupled to a first one of the data subgroups of a same bus width and wherein first one of non-volatile memory chip subgroups is coupled to the first one of interface bridge chip subgroups, and wherein the first one of the DRAM subgroups, the first one of interface bridge chip subgroups and the first one of non-volatile memory chip subgroups operate as an independent narrower non-volatile memory module coupled to the first one of data subgroups on the memory module.

18. The memory module of claim 17, wherein the register chip comprises a plurality of register output ports, wherein a first one of the plurality of register output ports is configured to control access to a first one of the plurality of DRAM subgroups.

19. The memory module of claim 18, wherein the plurality of register output ports is reconfigured to form a plurality of register output port subsets under control of a mode register in the register chip, to reconfigure a plurality of DRAM subsets from the plurality of DRAM subgroups, wherein the plurality of DRAM subsets operate independently under control of the plurality of register output port subsets.

20. The memory module of claim 17, wherein the bridge controller function device comprises a plurality of interface bridge output ports, wherein a first one of the plurality of interface bridge output ports is configured to control operation of a first subgroup of the plurality of interface bridge chips.

21. The memory module of claim 20, wherein the plurality of interface bridge output ports in the bridge controller function device is reconfigured to form a plurality of interface output port subsets under control of a mode register in the bridge controller function device to reconfigure a plurality of interface bridge chip subsets from the plurality of interface bridge chip subgroups, wherein the plurality of interface bridge chip subsets operate independently under control of the plurality of interface output port subsets.

22. The memory module of claim 17, further comprising: a second register chip configured to control access to one the plurality of DRAM subgroups; and
a second bridge controller function configured to control operation of one of the plurality of subgroups of the interface bridge chips.

23. The memory module of claim 1, further comprising a side band bus for access to control words in the register chip, the bridge controller chip, and on-board supporting components.

24. The memory module of claim 1 further comprising a plurality of resisters coupled between the memory data bus and the plurality of DRAM chips for impedance matching.

25. The memory module of claim 1, further comprising a plurality of data buffers coupled between the memory data bus and the plurality of DRAM chips to reduce loading of the memory data bus.

26. A method of assembling a nonvolatile memory module for connecting to a memory bus of a host system, the method comprising:
   providing a printed circuit board comprising an edge connector for plugging into a socket connected to the memory bus, wherein the edge connector comprises connection contacts to a memory data bus, an address/command bus, memory control signals, power and ground;
   coupling a plurality of DRAM chips to the memory bus;
   configuring a register chip to control data transfer between the memory data bus and the plurality of DRAM chips;
   providing a plurality of non-volatile memory chips;
   coupling a plurality of interface bridge chips to the memory bus each interface bridge chip being associated with a different one of the plurality of non-volatile memory chips and configured to control transfer of data between the data bus and the associated non-volatile memory chip; and
   configuring a bridge controller function device to control operation of the plurality of interface bridge chips to facilitate parallel data transfer between the memory data bus and the plurality of non-volatile memory chips, and parallel data transfer between the plurality of DRAM chips and the plurality of non-volatile memory chips.

27. The method of claim 26, wherein the register chip comprising comprises register output ports controlling the plurality of DRAM chips to facilitate parallel data transfer between the memory data bus and the plurality of DRAM chips; and
   the bridge controller function device comprises interface output ports controlling operation of the plurality of interface bridge chips to facilitate parallel data transfer between the memory data bus and the plurality of interface bridge chips, and further between the plurality of interface bridge chips and the plurality of the non-volatile memory chips.

* * * * *